(12) United States Patent
Hoshikawa et al.

(10) Patent No.: US 6,451,108 B2
(45) Date of Patent: Sep. 17, 2002

(54) METHOD FOR MANUFACTURING DISLOCATION-FREE SILICON SINGLE CRYSTAL

(75) Inventors: Keigo Hoshikawa; Xinming Huang, both of Nagano; Tatsuo Fukami, Suzaka; Toshinori Taishi, Koshoku, all of (JP)

(73) Assignee: President of Shinshu University, Matsumoto (JP)

( * ) Notice: Subject to any disclaimer, the term of this patent is extended or adjusted under 35 U.S.C. 154(b) by 33 days.

(21) Appl. No.: 09/767,225

(22) Filed: Jan. 23, 2001

(30) Foreign Application Priority Data

Feb. 25, 2000 (JP) ......................................... 2000-049667

(51) Int. Cl.$^7$ ............................................. C30B 15/20
(52) U.S. Cl. ............................. 117/19; 117/13; 117/14
(58) Field of Search .................................. 117/13, 14, 19

(56) References Cited

PUBLICATIONS

Dislocation–free B–doped Si crystal growth without Dash necking in Czochalski method: influence of B concentration Huang, et al, Journal of Crystal Growth 213 (2000), pp. 283–287.*

* cited by examiner

*Primary Examiner*—Felisa Hiteshew
(74) *Attorney, Agent, or Firm*—Oblon, Spivak, McClelland, Maier & Neustadt, P.C.

(57) ABSTRACT

A method for manufacturing a dislocation-free silicon single crystal, includes the steps of preparing a silicon seed crystal formed of a dislocation-free single crystal having a boron concentration of $1 \times 10^{18}$ atoms/cm$^3$ or more, preparing a silicon melt having a boron concentration which differs from that of the seed crystal by $7 \times 10^{18}$ atoms/cm$^3$ or less, and bringing the seed crystal into contact with the silicon melt to grow the silicon single crystal.

6 Claims, 3 Drawing Sheets

○: DISLOCATION FREE
●: DISLOCATIONS IN SEED CRYSTAL DUE TO THERMAL SHOCK
□: DISLOCATIONS IN GROWN CRYSTAL DUE TO LATTICE MISFIT
■: DISLOCATIONS IN BOTH SEED CRYSTAL AND GROWN CRYSTAL

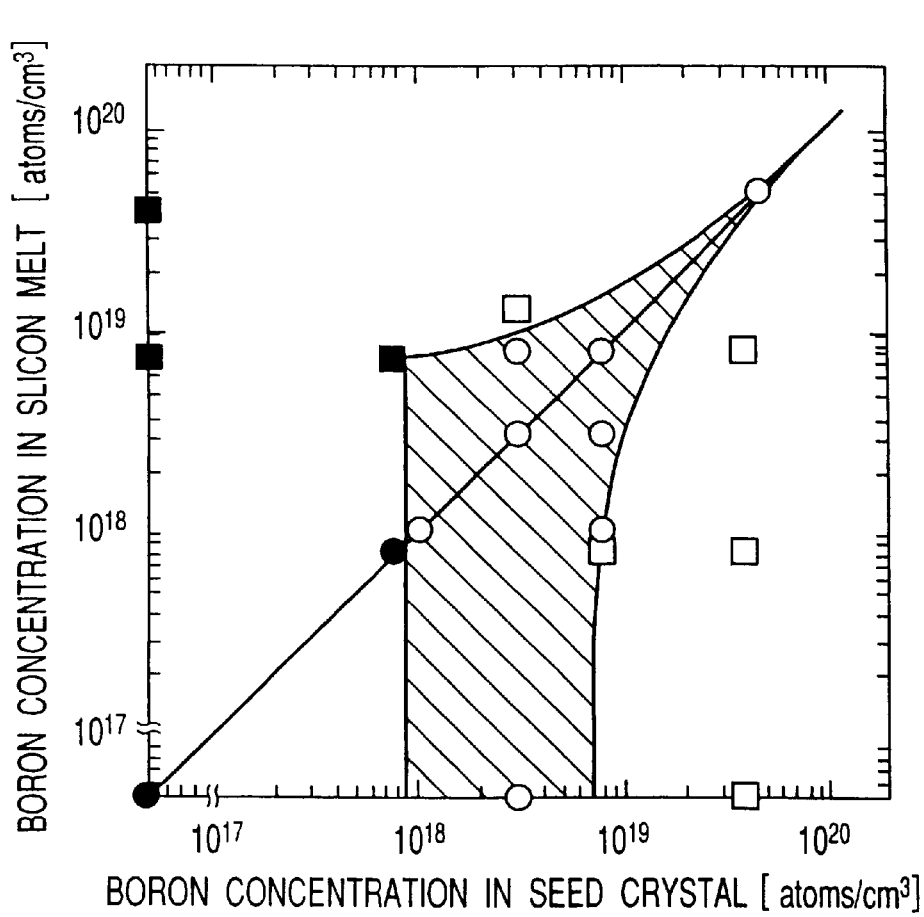
F I G. 1

METHOD FOR MANUFACTURING DISLOCATION-FREE SILICON SINGLE CRYSTAL

CROSS-REFERENCE TO RELATED APPLICATIONS

This application is based upon and claims the benefit of priority from the prior Japanese Patent Application No. 2000-049667, filed Feb. 25, 2000, the entire contents of which are incorporated herein by reference.

BACKGROUND OF THE INVENTION

The present invention relates to a method for manufacturing a semiconductor silicon (Si) single crystal for use in manufacturing process of a large-scale integrated circuit (LSI).

At present, the Si single crystal for use in the LSI manufacturing process is usually formed with a Czochralski (CZ) process or Floating Zone (FZ) process. To be more specific, most of the Si single crystals are formed with the CZ process. The CZ process is a method of growing the Si single crystal by bringing a seed crystal into contact with a Si melt (this step is called a "dipping process") and pulling the seed crystal. The FZ process is a method of growing the Si single crystal by heating an end of a raw-material rod formed of polycrystalline Si to melt it, bringing a Si seed crystal into contact with the melted portion, and moving the molten zone along the length of the rod.

In the CZ method, a necking process proposed by W. C. Dash in 1959 is employed to grow a dislocation-free single crystal. The necking process is performed after the dipping process to form a long, thin neck portion of 3–5 mm in diameter. The necking portion prevents the dislocations, which are generated in the seed crystal due to thermal shock during the dipping process, from propagating into the grown crystal. Thus, the necking process is an effective process for growing the dislocation-free single crystal. However, the probability of growing the dislocation-free single crystal with the necking process is not always 100%. In addition, the long, thin neck portion cannot support a large single crystal of not less than 100 kg weight which has been recently required in the LSI manufacturing process. The FZ process also uses the necking process so that it has the same problems described above.

BRIEF SUMMARY OF THE INVENTION

An object of the present invention is to provide a method for manufacturing a dislocation-free silicon single crystal without employing a necking process.

According to the present invention, there is provided a method for manufacturing a dislocation-free silicon single crystal, comprising the steps of:

preparing a silicon seed crystal formed of a dislocation-free single crystal having a boron concentration of $1 \times 10^{18}$ atoms/cm$^3$ or more;

preparing a silicon melt having a boron concentration which differs from that of the seed crystal by $7 \times 10^{18}$ atoms/cm$^3$ or less; and bringing the seed crystal into contact with the silicon melt to grow the silicon single crystal.

In the present invention, the silicon single crystal is preferably grown in accordance with a Czochralski process or a Floating Zone process.

In the present invention, the boron concentration of the seed crystal preferably ranges from $1 \times 10^{18}$ atoms/cm$^3$ to $7 \times 10^{18}$ atoms/cm$^3$, and more preferably $3 \times 10^{18}$ atoms/cm$^3$ to $5 \times 10^{18}$ atoms/cm$^3$.

Furthermore, in the present invention, the silicon melt is preferably boron undoped.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph of a relationship between a boron concentration in a seed crystal and a boron concentration in a grown crystal obtained in Examples of the present invention and Comparative Examples;

DETAILED DESCRIPTION OF THE INVENTION

Figures 2A, 2B, 2C:
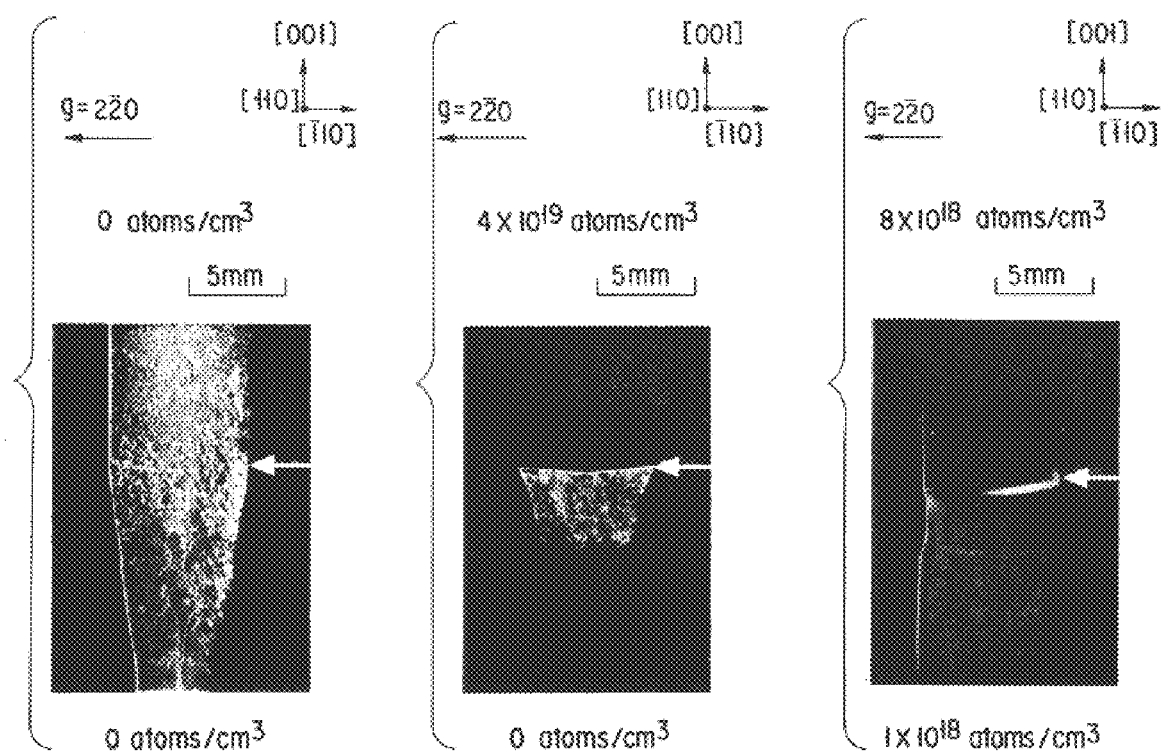
FIGS. 2A–2C are X-ray topographic images of Si single crystals obtained in the prior art and Examples of the present invention and Comparative Examples.

The present invention has been made during the research work on the growth technique of a heavily boron-doped crystal used for a substrate underlying an epitaxial wafer. The epitaxial wafer occupies about 20 percent of all Si wafers presently used in an LSI manufacturing process. More specifically, the present invention is based upon the following empirical facts found during the research work.

(1) When a dislocation-free single crystal doped with an impurity boron at $10^{18}$ atoms/cm$^3$ or more is used as a seed crystal, no dislocations due to thermal shock are generated in the seed crystal during the dipping process.

(2) Although a boron concentration difference between the seed crystal and grown crystal (particularly crystal grown immediately after dipping) can usually generate additional dislocations due to a lattice misfit, a boron concentration difference up to $7 \times 10^{18}$ atoms/cm$^3$ can form no dislocations due to the lattice misfit.

By combining above two facts, the dislocation-free Si single crystal can be grown without the necking process. In addition, since the boron concentration may differ between the seed crystal and the grown crystal to some extent to realize a dislocation-free crystal as described above, it is possible to grow the dislocation-free Si single crystal with the combination of the heavily boron-doped seed crystal and the boron-undoped Si melt, which results in a boron-undoped dislocation-free Si single crystal.

When the present invention is applied to the CZ process, a Si seed crystal and a Si melt, each containing boron in a predetermined amount, are prepared, and the seed crystal is brought into contact with the Si melt, and then the seed crystal is pulled to allow crystal growth. When the present invention is applied to the FZ process, a Si seed crystal and a polycrystalline Si raw-material rod, each containing boron in a predetermined amount, are prepared, an end of the rod is heated until it melts, the seed crystal is brought into contact with the melted portion, and the melted zone is moved along the length of the rod. In the present invention, the necking process is employed in neither process.

The concentration of boron in the seed crystal is preferably from $1 \times 10^{18}$ to $7 \times 10^{18}$ atoms/cm$^3$. Within this range, the boron-undoped dislocation-free Si single crystal can be grown from the boron-undoped Si melt. In particular, the boron concentration in the seed crystal preferably falls within $3 \times 10^{18}$ to $5 \times 10^{18}$ atoms/cm$^3$. Within this range, the boron-undoped dislocation-free Si single crystal can be grown more successfully from the boron-undoped Si melt. As used herein, the term "boron-undoped Si melt" refers to a Si melt containing boron in a general dopant concentration, such as $1 \times 10^{15}$ atoms/cm$^3$ or more, preferably $1 \times 10^{15}$ to $9 \times 10^{15}$ atoms/cm$^3$, and more preferably $1 \times 10^{15}$ to $3 \times 10^{15}$ atoms/cm$^3$. Furthermore, the boron-undoped Si melt may contain a dopant other than boron, such as phosphorous (P), arsenic (As), or antimony (Sb) in the same amount as for boron as mentioned above.

EXAMPLES

Now, examples of the present invention applied to the CZ process will be described. However, it should be noted that the present invention can also be applied to the FZ process.

A Si single crystal was manufactured from a Si melt by using a seed crystal of a boron-doped dislocation-free single crystal, in accordance with the CZ process. However, the necking process was not performed. Dislocations generated in both the seed crystal and the grown crystal were observed with X-ray topography method for varied combinations of the boron concentration in the seed crystal and the initial boron concentration in the Si melt. The crystal manufacturing conditions and the results are shown in Table 1 below.

TABLE 1

| Examples/ Comparative examples | Seed crystal | | Si melt | | | Grown crystal | | Diameter of quartz crucible (mm) | Dislocation in seed crystal | Dislocation in grown crystal |
|---|---|---|---|---|---|---|---|---|---|---|
| | B concentration (atoms/cm$^3$) | Cross section (mm × mm) | Initial B concentration (atoms/cm$^3$) | Weight of melt (g) | | Diameter (mm) | Length (mm) | | | |
| Example 1 | $4 \times 10^{19}$ | 7 × 7 | $4 \times 10^{19}$ | 2000 | | 70 | 50 to 100 | 150 | Not observed | Not observed |
| Example 2 | $8 \times 10^{18}$ | | $1 \times 10^{19}$ | | | | | | Not observed | Not observed |
| Example 3 | $8 \times 10^{18}$ | | $3 \times 10^{18}$ | | | | | | Not observed | Not observed |
| Example 4 | $8 \times 10^{18}$ | | $1 \times 10^{18}$ | | | | | | Not observed | Not observed |
| Example 5 | $3 \times 10^{18}$ | | $8 \times 10^{18}$ | | | | | | Not observed | Not observed |
| Example 6 | $3 \times 10^{18}$ | | $3 \times 10^{18}$ | | | | | | Not observed | Not observed |
| Example 7 | $3 \times 10^{18}$ | | 0 | | | | | | Not observed | Not observed |
| Example 8 | $1 \times 10^{18}$ | | $8 \times 10^{18}$ | | | | | | Not observed | Not observed |
| Example 9 | $1 \times 10^{18}$ | | $1 \times 10^{18}$ | | | | | | Not observed | Not observed |
| Example 10 | $1 \times 10^{18}$ | 12.5φ | $1 \times 10^{18}$ | 2000 | | 70 | 70 | 150 | Not observed | Not observed |
| Example 11 | $5 \times 10^{18}$ | 12.5φ | $5 \times 10^{18}$ | 45000 | | 150 | 810 | 400 | Not observed | Not observed |
| Example 12 | $3 \times 10^{18}$ | 7 × 7 | 0 (P: $5 \times 10^{15}$) | 2000 | | 70 | 80 | 150 | Not observed | Not observed |
| Comparative example 1 | $4 \times 10^{19}$ | 7 × 7 | $1 \times 10^{19}$ | 2000 | | 70 | 50 to 100 | 150 | Not observed | Observed |
| Comparative example 2 | $4 \times 10^{19}$ | | $1 \times 10^{18}$ | | | | | | Not observed | Observed |
| Comparative example 3 | $4 \times 10^{19}$ | | 0 | | | | | | Not observed | Observed |
| Comparative example 4 | $8 \times 10^{18}$ | | $8 \times 10^{17}$ | | | | | | Not observed | Observed |
| Comparative example 5 | $3 \times 10^{18}$ | | $4 \times 10^{19}$ | | | | | | Not observed | Observed |
| Comparative example 6 | $1 \times 10^{18}$ | | $1 \times 10^{19}$ | | | | | | Not observed | Observed |
| Comparative example 7 | $8 \times 10^{17}$ | | $8 \times 10^{18}$ | | | | | | Observed | Observed |
| Comparative example 8 | $8 \times 10^{17}$ | | $7 \times 10^{17}$ | | | | | | Observed | Not observed |

In Table 1 above, the boron-undoped Si melt was used in Example 7 and Comparative Example 3. In Example 12, a Si melt containing P at $5 \times 10^{15}$ atoms/cm$^3$ in place of boron, was used.

Table 1 shows that, in each Example, no dislocation due to the thermal shock was generated in the seed crystal and no dislocation due to the lattice misfit was generated in the grown crystal. Thus, it was demonstrated that dislocation-free crystals can be grown successfully in accordance with the present invention without the necking process. On the other hand, in Comparative Examples, dislocations were generated in at least one of the seed and grown crystal so that the dislocation-free crystal was not obtained.

The results of Examples 1–9 and Comparative Examples 1–8 listed in Table 1 are summarized in FIG. 1. As is apparent from the graph, the dislocation-free Si single crystal can be grown without the necking process within the boron-concentration range of the hatched region of the seed crystal and silicon melt (including the boron-undoped case).

Figure 3:
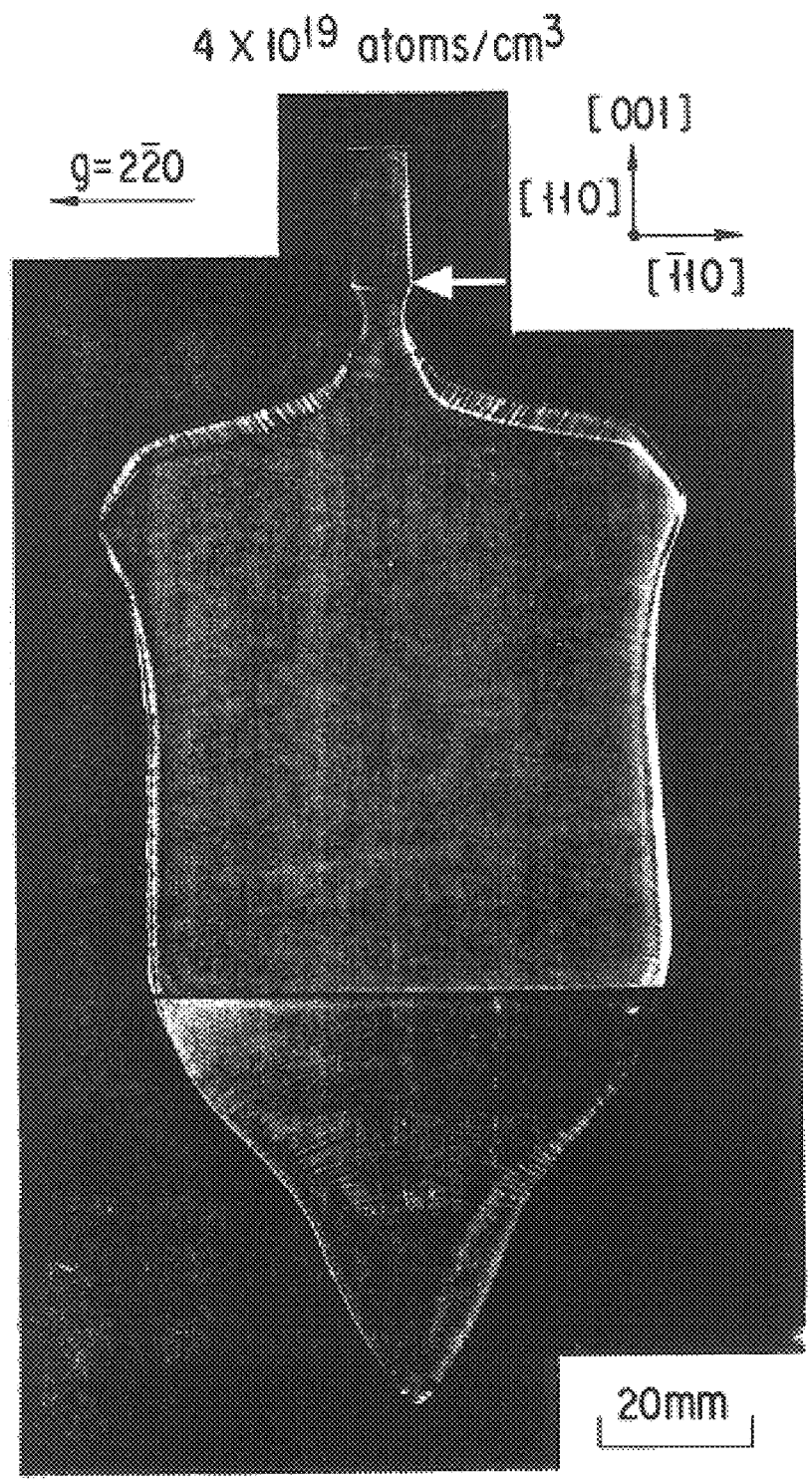
FIG. 3 is an X-ray topographic image of another example of a Si single crystal obtained in Examples of the present invention.

FIGS. 2A to 2C and 3 are examples of X-ray topographic images showing dislocations generated in the Si single crystal manufactured with the CZ process. FIG. 2A is an example of an X-ray topographic image of the Si single crystal manufactured with the conventional CZ process. FIGS. 2B, 2C and 3 are X-ray topographic images of the Si single crystal obtained in Comparative Examples and Examples mentioned above. FIGS. 2A to 2C show a portion near the boundary between the seed crystal and the grown crystal. The boundary is indicated by the arrow drawn in each image. The portion above the arrow is the seed crystal, whereas the portion below the arrow is the grown crystal. FIG. 3 shows a whole crystal. The numeral indicated above each image is the boron concentration of the seed crystal, whereas the numeral indicated below each image is the initial boron concentration of the Si melt. Furthermore, the direction of incident X-rays is indicated with a vector g above each image.

In the conventional technique shown in FIG. 2A, numerous dislocations due to thermal shock are generated in the seed crystal and propagated into the grown crystal. The dislocations are then removed at the neck portion (in the lower portion of the topographic), to provide the dislocation-free crystal.

In the single crystal manufactured in Comparative Example 3 (shown in FIG. 2B), it is found that no dislocations are generated in the seed crystal; however, misfit dislocations are generated in the grown crystal.

In the single crystal manufactured in Example 4 (shown in FIG. 2C), no dislocations are generated either in the seed crystal or in the grown crystal. It is clear that the dislocation-free crystal is successfully grown.

It is also illustrated by the FIG. 3 of the entire image of the single crystal manufactured in Example 1, that the dislocation-free single crystal is successfully grown according to the present invention.

As detailed in the above, according to the present invention, there is provided a method of manufacturing a dislocation-free Si single crystal without a necking process. The present invention can have further effects as follows.

(1) A long, thin neck portion is not required, so that the mechanical strength of the neck portion can increase. Therefore, a larger and heavier dislocation-free single crystal can be formed.

(2) The long, thin neck portion is not required, so that time can be saved, thereby, a manufacturing efficiency of the crystal can increase. Furthermore, the portion of the single crystal which is conventionally used for the neck portion, can be used for the grown crystal, so that a longer grown crystal can be obtained.

(3) An expert in the crystal growth does not need to check that the dislocation-free crystal is formed with the necking process, as is in a conventional case, so that the dislocation-free crystal can be easily formed even by a non-expert.

Furthermore, the present invention makes it possible to grow the boron-undoped dislocation-free Si single crystal, thereby being applicable in a wide variety of LSI manufacturing processes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a dislocation-free silicon single crystal, comprising the steps of:

preparing a silicon seed crystal formed of a dislocation-free single crystal having a boron concentration of $1 \times 10^{18}$ atoms/cm$^3$ or more;

preparing a silicon melt having a boron concentration which differs from that of the seed crystal by $7 \times 10^{18}$ atoms/cm$^3$ or less; and bringing the seed crystal into contact with the silicon melt to grow the silicon single crystal.

2. The method according to claim 1, wherein a Czochralski process or a Floating Zone process is used to grow the silicon single crystal.

3. The method according to claim 1, wherein a boron concentration of the seed crystal is $1 \times 10^{18}$ atoms/cm$^3$ to $7 \times 10^{18}$ atoms/cm$^3$.

4. The method according to claim 3, wherein the boron concentration of the seed crystal is $3 \times 10^{18}$ atoms/cm$^3$ to $5 \times 10^{18}$ atoms/cm$^3$.

5. The method according to claim 1, wherein the silicon melt is boron undoped.

6. The method according to claim 1, wherein the silicon melt contains at least one element selected from the group consisting of phosphorus, arsenic, and antimony.

* * * * *